(12) United States Patent
Marsh et al.

(10) Patent No.: US 8,551,808 B2
(45) Date of Patent: Oct. 8, 2013

(54) METHODS OF PATTERNING A SUBSTRATE INCLUDING MULTILAYER ANTIREFLECTION COATINGS

(75) Inventors: Eugene P. Marsh, Bosie, ID (US); Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/613,358

(22) Filed: Sep. 13, 2012

(65) Prior Publication Data

US 2013/0011561 A1    Jan. 10, 2013

Related U.S. Application Data

(62) Division of application No. 11/766,663, filed on Jun. 21, 2007, now Pat. No. 8,294,139.

(51) Int. Cl.
*H01L 51/40* (2006.01)

(52) U.S. Cl.
USPC .................. 438/99; 257/40; 257/E51.001

(58) Field of Classification Search
USPC ................ 257/40, E51.001; 438/99
See application file for complete search history.

(56) References Cited

U.S. PATENT DOCUMENTS

| | | | |
|---|---|---|---|
| 4,623,674 A | 11/1986 | Bailey | |
| 4,797,357 A | 1/1989 | Mura et al. | |
| 4,877,647 A | 10/1989 | Klabunde | |
| 5,328,810 A | 7/1994 | Lowrey et al. | |
| 5,374,367 A | 12/1994 | Edamura et al. | |
| 5,382,373 A | 1/1995 | Carlson | |
| 5,482,656 A | 1/1996 | Hiraoka et al. | |
| 5,512,131 A | 4/1996 | Kumar et al. | |
| 5,538,655 A | 7/1996 | Fauteux et al. | |
| 5,580,700 A | 12/1996 | Rahman et al. | |
| 5,620,850 A | 4/1997 | Bamdad et al. | |
| 5,622,668 A | 4/1997 | Thomas et al. | |
| 5,772,905 A | 6/1998 | Chou et al. | |
| 5,834,583 A | 11/1998 | Hancock et al. | |
| 5,849,810 A | 12/1998 | Mueller et al. | |
| 5,879,582 A | 3/1999 | Havelka et al. | |
| 5,879,853 A | 3/1999 | Azuma | |
| 5,891,356 A | 4/1999 | Inoue et al. | |
| 5,904,824 A | 5/1999 | Oh et al. | |
| 5,925,259 A | 7/1999 | Biebuyck et al. | |
| 5,948,470 A | 9/1999 | Harrison et al. | |

(Continued)

FOREIGN PATENT DOCUMENTS

| CN | 1562730 A | 1/2005 |
|---|---|---|
| CN | 1799131 A | 7/2006 |

(Continued)

OTHER PUBLICATIONS

Jun, Yongseok, et al., "Patterning protein molecules on poly(ethylene glycol) coated Si(111)," Biomaterials, vol. 25, pp. 3503-3509, 2004.

(Continued)

*Primary Examiner* — Anthony Ho
(74) *Attorney, Agent, or Firm* — TraskBritt

(57) ABSTRACT

Multi-layer antireflection coatings, devices including multi-layer antireflection coatings and methods of forming the same are disclosed. A block copolymer is applied to a substrate and self-assembled into parallel lamellae above a substrate. The block copolymer may optionally be allowed to self-assemble into a multitude of domains oriented either substantially parallel or substantially perpendicular to an underlying substrate.

20 Claims, 5 Drawing Sheets

(56) References Cited

U.S. PATENT DOCUMENTS

| | | |
|---|---|---|
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,207,787 B1 | 3/2001 | Fahey et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim et al. |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,723,009 B2 | 5/2010 | Sandhu et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,294,139 B2 | 10/2012 | Marsh et al. |
| 8,372,295 B2 | 2/2013 | Millward |
| 8,394,483 B2 | 3/2013 | Millward |
| 8,404,124 B2 | 3/2013 | Millward et al. |
| 8,409,449 B2 | 4/2013 | Millward et al. |
| 8,425,982 B2 | 4/2013 | Regner |
| 8,426,313 B2 | 4/2013 | Millward et al. |
| 2001/0024768 A1 | 9/2001 | Matsuo et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |

| | | |
|---|---|---|
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski et al. |
| 2003/0222048 A1 | 12/2003 | Asakawa et al. |
| 2003/0235930 A1 | 12/2003 | Bao et al. |
| 2004/0028875 A1 | 2/2004 | Van Rijn et al. |
| 2004/0058059 A1 | 3/2004 | Linford et al. |
| 2004/0084298 A1 | 5/2004 | Yao et al. |
| 2004/0124092 A1 | 7/2004 | Black |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0147841 A1 | 7/2005 | Tavkhelidze |
| 2005/0167651 A1 | 8/2005 | Merkulov et al. |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | De Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0133017 A1 | 5/2012 | Millward et al. |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 B1 | 4/2000 |
| EP | 1416303 A2 | 5/2004 |

| | | | |
|---|---|---|---|
| EP | 1906237 A2 | 4/2008 | |
| EP | 1593164 B1 | 6/2010 | |
| JP | 11080414 A | 3/1999 | |
| JP | 2005008882 A | 1/2005 | |
| JP | 2005029779 A | 2/2005 | |
| JP | 2006036923 A | 2/2006 | |
| JP | 2006055982 A | 3/2006 | |
| JP | 2006110434 A | 4/2006 | |
| JP | 2007194175 | 8/2007 | |
| JP | 2008036491 A | 2/2008 | |
| KR | 1020060128378 A | 12/2006 | |
| KR | 20070029762 | 3/2007 | |
| KR | 100771886 B1 | 11/2007 | |
| TW | 200400990 | 3/1992 | |
| TW | 200633925 | 10/1994 | |
| TW | 200740602 | 1/1996 | |
| TW | 256110 | 4/2004 | |
| TW | 584670 B | 4/2004 | |
| TW | 200419017 | 10/2004 | |
| TW | 200511364 | 3/2005 | |
| TW | I253456 | 11/2007 | |
| TW | 200802421 | 1/2008 | |
| WO | 9007575 | 7/1990 | |
| WO | 9706013 A1 | 2/1997 | |
| WO | 9839645 A1 | 9/1998 | |
| WO | 9947570 A1 | 9/1999 | |
| WO | 0031183 A1 | 6/2000 | |
| WO | 0218080 | 3/2002 | |
| WO | 02081372 A2 | 10/2002 | |
| WO | 03045840 A2 | 6/2003 | |
| WO | 2005122285 A2 | 12/2005 | |
| WO | 2006003592 A2 | 1/2006 | |
| WO | 2006003594 A2 | 1/2006 | |
| WO | 2006076016 A2 | 7/2006 | |
| WO | 2006078952 A1 | 7/2006 | |
| WO | 2006112887 A2 | 10/2006 | |
| WO | 2007001294 A1 | 1/2007 | |
| WO | 2007013889 A2 | 2/2007 | |
| WO | 2007024241 A2 | 3/2007 | |
| WO | 2007024323 A2 | 3/2007 | |
| WO | 2007019439 A3 | 5/2007 | |
| WO | 2007055041 A1 | 5/2007 | |
| WO | 2008055137 A2 | 5/2008 | |
| WO | 2008091741 A2 | 7/2008 | |
| WO | 2008096335 A2 | 8/2008 | |
| WO | 2008097736 A2 | 8/2008 | |
| WO | 2008118635 A2 | 10/2008 | |
| WO | 2008124219 A2 | 10/2008 | |
| WO | 2008130847 A1 | 10/2008 | |
| WO | 2008145268 A1 | 12/2008 | |
| WO | 2008156977 A2 | 12/2008 | |
| WO | 2009099924 A2 | 8/2009 | |
| WO | 2009102551 A2 | 8/2009 | |
| WO | 2009117238 A2 | 9/2009 | |
| WO | 2009117243 A1 | 9/2009 | |
| WO | 2009134635 A2 | 11/2009 | |

OTHER PUBLICATIONS

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007.

Black, C.T., "Self-aligned self-assembly of multi-nanowire silicon field effect transistors," Appl. Phys. Lett., vol. 87, pp. 163116-1 through 163116-3, 2005.

Black, Charles T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.

Cha et al., Biomimetic Approaches for Fabricating High-Density Nanopatterned Arrays, Chem. Mater. vol. 19, 2007, pp. 839-843.

Chai et al., Assembly of Aligned Linear Metallic Patterns on Silicon, Nature Nanotechnology, vol. 2, Aug. 2007, pp. 500-506.

Chai et al., Using Cylindrical Domains of Block Copolymers to Self-Assemble and Align Metallic Nanowires, American Chemical Society, www.Acsnano.org, 2008. pp. A-K.

Chen et al., Highly Ordered Arrays of Mesoporous Silica Nanorods with Tunable Aspect Ratios from Block Copolymer Thin Films, Advanced Materials, vol. 20, pp. 763-767, 2008.

Cho et al., Nanoporous Block Copolymer Micelle/Micelle Multilayer Films with Dual Optical Properties, J. Am. Chem. Soc., vol. 128, No. 30, pp. 9935-9942 (2006).

Clark et al., "Selective Deposition in Multilayer Assembly: SAMs as Molecular Templates," Supramolecular Science, vol. 4, pp. 141-146, (1997).

Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.

Fasolka et al., Block Copolymer Thin Films: Physics and Applications1, Annual Review, vol. 31, pp. 323-355 (2001).

Gates, "Nanofabrication with Molds and Stamps," Materials Today, pp. 44-49, (Feb. 2005).

Grubbs, Hybrid Metal-Polymer Composites from Functional Block Copolymers, Journal of Polymer Science: Part A: Polymer Chemistry, vol. 43, pp. 4323-4336 (2005).

Guarini et al., Nanoscale Patterning Using Self-Assembled Polymers for Semiconductor Applications, J. Vac. Sci. Technol. B 19(6), pp. 2784-2788, Nov./Dec. 2001.

Jun, Yongseok, et al., "Microcontact Printing Directly on the Silicon Surface," Langmuir, vol. 18, No. 9, pp. 3415-3417, 2002.

Hadziioannou, Semiconductor Block Copolymers for Self-Assembled Photovoltaic Devices, MRS Bulletin, pp. 456-460 (2002).

Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.

Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.

Helmuth, Jo A., et al., "High-Speed Microcontact Printing," J. Am. Chem. Soc., vol. 128, No. 29, pp. 9296-9297, 2006.

Horiuchi et al., Three-Dimensional Nanoscale Alignment of Metal Nanoparticles Using Block Copolymer Films as Nanoreactors, Langmuir, vol. 19, pp. 2963-2973 (2003).

Huang et al., "Stretchable gold conductors on elastomeric substrates," Applied Physics Letters, vol. 82, No. 15, p. 2404.

Huang et al., "Using Surface Active Random Copolymers to Control the Domain Orientation in Diblock Copolymer Thin Films," Macromolecules, 1998, 31, 7641-7650.

Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.

Ji et al., Molecular Transfer Printing Using Block Copolymers, ACS Nano, vol. 4, No. 2, pp. 599-609, 2010.

Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.

Johnson, Daniel L., et al., "Probing the stability of the disulfide radical intermediate of thioredoxin using direct electrochemistry," Letters in Peptide Science, vol. 10, pp. 495-500, 2003.

Kavakli et al., Single and Double-Layer Antireflection Coatings on Silicon, Turk J Phys, vol. 26, pp. 349-354 (2002).

Krishnamoorthy et al., Block Copolymer Micelles as Switchable Templates for Nanofabrication, Languir, vol. 22, No. 8, Mar. 17, 2006, pp. 3450-3452.

Kuhnline et al., "Detecting thiols in a microchip device using micromolded carbon ink electrodes modified with cobalt phthalocyanine", Analyst, vol. 131, pp. 202-207, (2006).

Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.

Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.

Lopes et al., Hierarchical Self-Assembly of Metal Nanostructures on Diblock Copolymer Scaffolds, Nature, vol. 414, Dec. 13, 2001, pp. 735-738.

Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.

Malenfant et al., Self-Assembly of an Organic-Inorganic Block Copolymer for Nano-Ordered Ceramics, Nature Nanotechnology, vol. 2, pp. 43-46 (2007).

Niu, Sanjun, et al., "Selective assembly of nanoparticles on block copolymer by surface modification," Nanotechnology, vol. 18, pp. 1-4, 2007.

Park et al., Fabrication of Highly Ordered Silicon Oxide Dots and Stripes from Block Copolymer Thin Films, Advanced Materials, vol. 20, pp. 681-685, 2008.

Park et al., High-Aspect-Ratio Cylindrical Nanopore Arrays and Their Use for Templating Titania Nanoposts, Advanced Materials, vol. 20, pp. 738-742, 2008.

Park, Sang-Min, et al., "Directed assembly of lamellae-forming block copolymers using chemically and topographically patterned substrates," 16 pages, no date.

Reed, M.A., et al., "Molecular random access memory cell," Appl. Phys. Lett., vol. 78, No. 23, pp. 3735-3737, Jun. 2001.

Rozkiewicz, Dorota I., et al., "'Click' Chemistry by Microcontact Printing," Angew. Chem. Int. Ed., vol. 45, pp. 5292-5296, 2006.

Ruiz, R., et al., "Induced Orientational Order in Symmetric Diblock Copolymer Thin-Films," submitted to Advanced Materials, 12 pages, Jan. 25, 2007.

Sang et al., "Epitaxial self-assembly of block copolymers on lithographically defined nanopatterned substrates", Nature, vol. 24, pp. 411-414, (Jul. 2003).

Sato et al., Novel Antireflective Layer Using Polysilane for Deep Ultraviolet Lithography, J. Vac. Sci. Technol. B, vol. 17, No. 6, pp. 3398-3401 (1999).

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Tadd et al, Spatial Distribution of Cobalt Nanoclusters in Block Copolymers, Langmuir, vol. 18, pp. 2378-2384 (2002).

Trimbach et al., "Block Copolymer Thermoplastic Elastomers for Microcontact Printing," Langmuir, 2003, vol. 19, p. 10957.

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Xu et al., Electric Field Alignment of Symmetric Diblock Copolymer Thin Films, Department of Polymer Science and Engineering, University of Massachusetts, 5 pages (2003).

Xu et al., Interfacial Interaction Dependence of Microdomain Orientation in Diblock Copolymer Thin Films, Macromolecules, vol. 38, pp. 2802-2805 (2005).

Yamaguchi et al., Resist-Pattern Guided Self-Assembly of Symmetric Diblock Copolymer, Journal of Photopolymer Science and Technology, vol. 19, No. 3, pp. 385-388 (2006).

Yang et al., Covalently Attached Graft Polymer Monolayer on Organic Polymeric Substrate via Confined Surface Inhibition Reaction, Journal of Polymer Science-A-Polymer Chemistry Edition, Sep. 28, 2006, pp. 745-755, vol. 45, Issue 5.

Yu et al., Contact Printing Beyond Surface Roughness: Liquid Supramolecular Nanostamping, Advanced Materials, vol. 19, 2007, pp. 4338-4342.

Zaumseil et al., "Three-Dimensional and Multilayer Nanostructures Formed by Nanotransfer Printing," Nano Letters, 2003, vol. 3, No. 9, pp. 1223-1227.

Zehner, Robert W., et al., "Selective Decoration of a Phase-Separated Diblock Copolymer with Thiol-Passivated Gold Nanocrystals," Langmuir, vol. 14, No. 2, pp. 241-243, Jan. 20, 1998.

Zhang et al., "Self-Assembled Monolayers of Terminal Alkynes on Gold," J. Am. Chem. Soc., vol. 129, No. 16, pp. 4876-4877, 2007.

Zhao et al., Colloidal Subwavelength Nanostructures for Antireflection Optical Coatings, Optics Letters, vol. 30, No. 14, pp. 1885-1887 (2005).

Zhou et al., Nanoscale Metal/Self-Assembled Monolayer/Metal Heterostructures, American Institute of Physics, pp. 611-613 (1997).

Zhu, X.Y., et al., "Grafting of High-Density Poly(Ethylene Glycol) Monolayers on Si(111)," Langmuir, vol. 17, pp. 7798-7803, 2001.

Zhu, X.Y., et al., "Molecular Assemblies on Silicon Surfaces via Si-O Linkages," Langmuir, vol. 16, pp. 6766-6772, 2000.

Ali, H. A., et al., Properties of Self-assembled ZnO Nanostructures, Solid-State Electronics 46 (2002), 1639-1642.

Arshady, R., et al., "The Introduction of Chloromethyl Groups into Styrene-based Polymers, 1," Makromol. Chem., vol. 177, 1976, p. 2911-2918.

Bae, Joonwon, "Surface Modification Using Photo-Crosslinkable Random Copolymers", Abstract submitted for the Mar. 2006 meeting of The American Physical Society, submitted Nov. 30, 2005. (Accessed via the Internet [retrieved on Apr. 5, 2010], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., "The Effect of Humidity on the Ordering of Tri-block Copolymer Thin Films," Abstract submitted for the Mar. 2007 meeting of The American Physical Society, submitted Nov. 20, 2006.

Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J. P., et al., "Chemisorbed Poly(propylene sulphide)-based Copolymers Resist Biomolecular Interactions," Nature Materials 2, 259-264, 2003, (published online Mar. 23, 2003). Published online Mar. 23, 2003.

Berry, B. C., et al., "Orientational Order in Block Copolymer Films Zone Annealed Below the Order—Disorder Transition Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Berry, B. C., et al., "Effects of Zone Annealing on Thin Films of Block Copolymers", National Institute of Standard and Technology, Polymers Division, Maryland, USA, 2007, 2 pages.

Black et al., Integration of Self-Assembled Diblock Copolymers for Semiconductor Capacitor Fabrication, Applied Physics Letters, vol. 79, No. 3, pp. 409-411 (2001).

Black et al., Polymer Self Assembly in Semiconductor Microelectronics, IBM J. Res. & Dev. vol. 51, No. 5, Sep. 2007, pp. 605-633.

Black, C. T., "Polymer Self-Assembly as a Novel Extension to Optical Lithography," ACSNano, vol. 1, No. 3, 2007, American Chemical Society, pp. 147-150.

Black, C. T., et al., "High-Capacity, Self-Assembled Metal-Oxide-Semiconductor Decoupling Capacitors," IEEE Electron Device Letters, vol. 25, No. 9, Sep. 2004, pp. 622-624.

Black, C. T., et al., "Self Assembly in Semiconductor Microelectronics: Self-Aligned Sub-Lithographic Patterning Using Diblock Copolymer Thin Films," Proc. of SPIE, vol. 6153, 615302 (2006).

Botelho Do Rego, A. M, et al., "Diblock Copolymer Ultrathin Films Studied by High Resolution Electron Energy Loss Spectroscopy," Surface Science, 482-485 (2001), pp. 1228-1234.

Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Bulpitt, P., et al, "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Published online Aug. 13, 1999, Abstract only.

Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/Lc/article.asp?doi=b51066c) (Abstract).

Candau, F., et al., "Synthesis and Characterization of Polystyrene-poly(ethylene oxide) Graft Copolymers," Polymer, 1977, vol. 18, pp. 1253-1257.

Cavicchi, K. A., et al., "Solvent Annealed Thin Films of Asymmetric Polyisoprene—Polylactide Diblock Copolymers," Macromolecules 2007, vol. 40, 2007, Univ. of Massachusetts, pp. 1181-1186.

Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

Chang, Li-Wen, "Diblock Copolymer Directed Self-Assembly for CMOS Device Fabrication," Proc. of SPIE, vol. 6156, 2006, 615611-1 to 615611-6.

Chang, Li-Wen, "Experimental Demonstration of Aperiodic Patterns of Directed Self-Assembly of Block Copolymer Lithography for Random Logic Circuit Layout," IEEE International Electron Devices Meeting (IEDM), paper 33.2, Dec. 6-8, San Francisco, 2010, pp. 33.2.1-33.2.4.

Cheng, J. Y., et al., "Rapid Directed Self Assembly of Lamellar Microdomains from a Block Copolymer Containing Hybrid," Applied Physics Letters, 91, 143106-143106-3 (2007).

Cheng, J. Y., et al., "Self-Assembled One-Dimensional Nanostructure Arrays," Nano Letters, vol. 6, No. 9, 2006, pp. 2099-2103.

Cheng, J.Y., et al., "Templated Self-Assembly of Block Copolymers: Effect of Substrate Topography," Adv. Mater. 2003, vol. 15, No. 19, pp. 1599-1602.

Choi, H. J., et al., "Magnetorheology of Synthesized Core—Shell Structured Nanoparticle," IEEE Transactions on Magnetics, vol. 41, No. 10, Oct. 2005, pp. 3448-3450.

Daoulas Kostas Ch., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-3.

Darling, S. B., "Directing the Self-assembly of Block Copolymers," Progress in Polymer Science, vol. 32, No. 10, Sep. 28, 2007, pp. 1152-1204.

Desai, Dr. Trejal A., et al., "Engineered Silicon Surfaces for Biomimetic Interfaces," Business Briefing: Medical Device Manufacturing & Technology, 2002.

Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 3444-3459, 2005.

Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.

Elisseeff, J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.

Fasolka et al., Block Copolymer Thin Films: Physics and Applications, Annual Review, vol. 31, pp. 323-355 (2001).

Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.

Gates, B. D., et al., "Unconventional Nanofabrication," Annu. Rev. Mater. Res. 2004, 34:339-72.

Ge, Zhenbin, et al., "Thermal Conductance of Hydrophilic and Hydrophobic Interfaces," PRL 96, 186101-1-186101-4, The American Physical Society, week ending May 12, 2006.

Gelest Inc., "Silane Coupling Agents: Connecting Across Boundaries," v2.0, 2006, pp. 1-56.

Genua, A., et al., "Functional Patterns Obtained by Nanoimprinting Lithography and Subsequent Growth of Polymer Brushes," Nanotechnology, 18, (2007), IOP Publishing Ltd., pp. 1-7.

Gillmor, S. D., et al., "Hydrophilic/Hydrophobic Patterned Surfaces as Templates for DNA Arrays," Langmuir 2000, vol. 16, No. 18, 2000, pp. 7223-7228.

Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, (2004), pp. 6193-6208.

Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, 2005 Wiley Periodicals, Inc., pp. 3932-3944.

Hamley, I. W., "Introduction to Block Copolymers", Developments in Block Copolymers Science and Technology, John Wiley & Sons, Ltd., 2004, pp. 1-29.

Hammond, M. R., et al., "Temperature Dependence of Order, Disorder, and Defects in Laterally Confined Diblock Copolymer Cylinder Monolayers," Macromolecules, vol. 38, Jul. 2005; American Chemical Society, p. 6575-6585.

Harrison, C., et al., "Layer by Layer Imaging of Diblock Copolymer Films with a Scanning Electron Microscope," Polymer, vol. 39, No. 13, 1998, pp. 2733-2744.

Hawker, C. J., et al., "Facile Synthesis of Block Copolymers for Nanolithographic Applications," Polymer Reprints, American Chemical Society (2005).

Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.

He et al., "Self-Assembly of Block Copolymer Micelles in an Ionic Liquid," J. Am. Chem. Soc. 2006, 128, pp. 2745-2750.

Helmbold, A., et al., "Optical Absorption of Amorphous Hydrogenated Carbon Thin Films," Thin Solid Films 283 (1996) pp. 196-203.

Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.

Peng, J., et. al., "Development of Nanodomain and Fractal Morphologies in Solvent Annealed Block copolymer Thin Films," Macromol. Rapid Commun. 2007, 28, pp. 1422-1428.

Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.

Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.

Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.

Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.

Rogers, J. A., "Slice and Dice, Peel and Stick: Emerging Methods for Nanostructure Fabrication," ACS Nano, vol. 1, No. 3, 2007, pp. 151-153.

Ruiz, R., et al., "Density Multiplication and Improved Lithography by Directed Block Copolymer Assembly," Science, vol. 321, Aug. 15, 2008, pp. 936-939.

Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.

Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.

Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.

Segalman, R. A., "Patterning with Block Copolymer Thin Films," Materials Science and Engineering R 48 (2005), Elsevier B. V., pp. 191-226.

Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.

Sharma, S. et al., "Ultrathin Poly(ethylene glycol) Films for Silicon-based Microdevices," Applied Surface Science, 206 (2003), Elsevier Science B.V., pp. 218-229.

Sigma-Aldrich, 312-315Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.

Sivaniah, E., et al., "Observation of Perpendicular Orientation in Symmetric Diblock Copolymer Thin Films on Rough Substrates," Macromolecules 2003, 36, American Chemical Society, pp. 5894-5896.

Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.

Solak, H. H., "Nanolithography with Coherent Extreme Ultraviolet Light," Journal of Physics D: Applied Physics, 2006, IOP Publishing Ltd., UK, pp. R171-188.

Srinvivasan, C., et al., "Scanning Electron Microscopy of Nanoscale Chemical Patterns," ACS Nano, vol. 1, No. 3, pp. 191-201, 2007.

Stoykovich, M. P., et al., "Directed Assembly of Block Copolymer Blends into Nonregular Device-Oriented Structures," Science, vol. 308, Jun. 3, 2005, pp. 1442-1446.

Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.

Sundrani, D., et al., "Guiding Polymers to Perfection: Macroscopic Alignment of Nanoscale Domains," Nano Lett., vol. 4, No. 2, 2004, American Chemical Society, pp. 273-276.

Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.

Tang et al., Evolution of Block Copolymer Lithography to Highly Ordered Square Arrays, Science, vol. 322, No. 5900, Sep. 25, 2008, pp. 429-432.

Truskett, V. M., et al., "Trends in Imprint Lithography for Biological Applications," TRENDS in Biotechnology, vol. 24, No. 7, Jul. 2006, pp. 312-315.

Tseng et al., Enhanced Block Copolymer Lithography Using Sequential Infiltration Synthesis, The Journal of Physical Chemistry, vol. 115, No. 36, Sep. 15, 2011, 15 pages.

Van Poll, M. L., et al., "A Self-Assembly Approach to Chemical Micropatterning of Poly(dimethylsiloxane)," Angew. Chem. Int. Ed. 2007, 46, pp. 6634-6637.

Wang, C., et al., "One Step Fabrication and characterization of Platinum Nanopore Electrode Ensembles formed via Amphiphilic Block Copolymer Self-assembly," Electrochimica Acta 52 (2006), pp. 704-709.

Wathier, M., et al., "Dendritic Macromers as in Situ Polymerizing Biomaterials for Securing Cataract Incisions," J. Am. Chem. Soc., 2004, 126 (40), pp. 12744-12745, Abstract only.

Winesett, D.A., et al., "Tuning Substrate Surface Energies for Blends of Polystyrene and Poly(methyl methacrylate)," Langmuir 2003, 19, American Chemical Society, pp. 8526-8535.

Wipf, "Handbook of Reagents for Organic Synthesis", 2005, John Wiley & Sons Ltd., p. 320.

Wu C.Y., et al., "Self-Assembled Two-Dimensional Block Copolymers on Pre-patterned Templates with Laser Interference Lithography," IEEE, 2007, pp. 153-154.

Xiao, Shuaigang., et al., "Graphoepitaxy of Cylinder-forming Block Copolymers for Use as Templates to Pattern Magnetic Metal Dot Arrays," Nanotechnology 16, IPO Publishing Ltd, UK (2005), pp. S324-S329.

Xu, F.J., et al., "Surface-Initiated Atom Transfer Radical Polymerization from Halogen-Terminated Si(111) (Si-X, X=Cl, Br) Surfaces for the Preparation of Well-Defined Polymer-Si Hybrids," Langmuir, vol. 21, No. 8, pp. 3221-3225, 2005.

Xu, Ting, et al., "The Influence of Molecular Weight on Nanoporous Polymer Films," Polymer 42, Elsevier Science Ltd., (2001) pp. 9091-9095.

Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.

Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.

Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.

Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.

Yurt, Serkan, et al., "Scission of Diblock Copolymers into Their Constituent Blocks," Macromolecules 2006, vol. 39, No. 5, 2006, American Chemical Society, pp. 1670-1672.

Zhang, Mingfu, et al., "Highly Ordered Nanoporous Thin Films from Cleavable Polystyrene-block-poly(ethylene oxide),"Adv. Mater. 2007, 19, pp. 1571-1576.

Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.

Hutchison, J. B, et al., "Polymerizable Living Free Radical Initiators as a Platform to Synthesize Functional Networks," Chem. Mater., vol. 17, No. 19, 2005, pp. 4789-4797.

Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.

In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. of Wisconsin-Madison, pp. 7855-7860.

Ji, Shengxiang, et al., "Generalization of the Use of Random Copolymers to Control the Wetting Behaviors of Block Copolymer Films," Macromolecules, 2008, 41(23): 9098-9103.

Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.

Karim, Alamgir, et al., "Control of Ordering Kinetics and Morphology Using Zone Annealing of Thin Block Copolymer Films", Abstract submitted for the Mar. 2007 Meeting of The American Physical Society, Nov. 20, 2006.

Kim, Is, et al., "Self-assembled Hydrogel Nanoparticles Composed of Dextran and Poly (ethylene glycol) Macromer," Int J Pharm., Sep. 15, 2000; 205(1-2): 109-116, Abstract only.

Kim, Sang Ouk, et al., "Epitaxial Self-assembly of Block Copolymers on Lithographically Defined Nanopatterned Substrates," Nature, vol. 424, Jul. 24, 2003, Dept. of Chemical Engineering and Center for Nanotechnology, and Dept. of Mechanical Engineering, Univ. of Wisconsin, pp. 411-414.

Kim, Sang Ouk, et al., "Novel Complex Nanostructure from Directed Assembly of Block Copolymers on Incommensurate Surface Patterns," Adv. Mater., 2007, 19, pp. 3271-3275.

Kim, Seung Hyun, et al., "Highly Oriented and Ordered Arrays from Block Copolymers via Solvent Evaporation," Adv. Mater. 2004, 16, No. 3, Feb. 3, pp. 226-231.

Kim, Seung Hyun, et al., "Salt Complexation in Block Copolymer Thin Films," Macromolecules 2006, vol. 39, No. 24, 2006, pp. 8473-8479.

Kim, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.

Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.

Kim, SH, et al., "Synthesis and characterization of Dextran-methacrylate Hydrogels and Structural Study by SEM," J Biomater Res., Mar. 15, 2000; 49(4): 517-27 Abstract only.

Kim, Su-Jin, et al., "Hybrid Nanofabrication Processes Utilizing Diblock Copolymer Nanoternplate Prepared by Self-assembled Monolayer Based Surface Neutralization," J. Vac. Sci. Technol. B26(1), Jan./Feb. 2008, © 2008 American Vacuum Society, pp. 189-194.

Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.

Krishnamoorthy et al., Nonopatterned Self-Assembled Monolayers by Using Diblock Copolymer Micelles as nanometer-Scale Adsorption and Etch Masks, Advanced Materials, 2008, pp. 1-4.

Krishnamoorthy, S., et al., "Nanoscale Patterning with Block Copolymers," Materials Today, vol. 9, No. 9, Sep. 2006, pp. 40-47.

La, Young-Hye, et al., "Directed Assembly of Cylinder-Forming Block Copolymers into Patterned Structures to Fabricate Arrays of Spherical Domains and Nanoparticles," Chem. Mater, 2007, vol. 19, No. 18, Department of Chemical and Biological Engineering and Center for Nanotechnology, Univ. of Wisconsin, pp. 4538-4544.

La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.

Laracuente, A.R., et al., "Step Structure and Surface Morphology of Hydrogen-terminated Silicon: (001) to (114)," Surface Science 545, 2003, pp. 70-84.

Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.

Li, Mingqi, et al., "Block Copolymer Patterns and Templates," Materials Today, vol. 9, No. 9, Sep. 2006, pp. 30-39.

Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.

Li, Xue, et al., "Morphology Change of Asymmetric Diblock Copolymer Micellar Films During Solvent Annealing," ScienceDirect, Polymer 48 (2007), pp. 2434-2443.

Lin, Zhiqun, et al., "A Rapid Route to Arrays of Nanostructures in Thin Films," Adv. Mater. 2002, 14 No. 19, Oct. 2, pp. 1373-1376.

Lin-Gibson, Sheng, et al., "Structure—Property Relationships of Photopolymerizable Poly(ethylene glycol) Dimethacrylate Hydrogels," Macromolecules 2005, 38, American Chemical Society, pp. 2897-2902.

Lutolf, M., et al., "Cell-Responsive Synthetic Hydrogels," Adv. Mater., vol. 15, No. 11, Jun. 2003, pp. 888-892.

Lutolf, M.P., et al, "Synthetic Biomaterials as Instructive Extracellular Microenvironments for Morphogenesis in Tissue Engineering," Nature Biotechnology, 23, 47-55 (2005), Abstract only.

Malkoch, M., et al., "Synthesis of Well-defined Hydrogel Networks Using Click Chemistry," Chem. Commun., 2006, The Royal Society of Chemistry, pp. 2774-2776.

Mansky, P., et al., "Controlling Polymer-Surface Interactions with Random Copolymer Brushes," Science, vol. 275, Mar. 7, 1997, pp. 1458-1460.

Martens, P., et al., "Characterization of Hydrogels Formed from Acrylate Modified Poly(vinyl alcohol) Macromers," Polymer, vol. 41, Issue 21, Oct. 2000, pp. 7715-7722, Abstract only.

Matsuda, T., et al., "Photoinduced Prevention of Tissue Adhesion," ASAIO J, Jul.-Sep. 1992; 38(3): M154-7, Abstract only.

Maye, M. A., et al., "Chemical Analysis Using Force Microscopy," Journal of Chemical Education, vol. 79, No. 2, Feb. 2002, Dept. of Chemistry, State Univ. of New York at Binghamton, USA, pp. 207-210.

Metters, A., et al., "Network Formation and Degradation Behavior of Hydrogels Formed by Michael-Type Addition Reactions," Biomacromolecules 2005, 6, 2005, pp. 290-301.

Meyer, E., et al., "Controlled Dewetting Processes on Microstructured Surfaces—a New Procedure for Thin Film Microstructuring," Macromollecular Mater. Eng., 276/277, 2000, Institute of Polymer Research Dresden, pp. 44-50.

Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.

Mindel, J., et.al., "A Study of Bredig Platinum Sols", The Chemical Laboratories of New York University, received Jun. 10, 1943, vol. 65 pp. 2112.

Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.

Nealey, P. F., et al., "Self-Assembling Resists for Nanolithography", IProceedings of the IEEE International Electron Devices Meeting, IEDM Technical Digest, 356-359 (2005).

Nguyen, K. T., et al., "Photopolymerizable Hydrogels for Tissue Engineering Applications," Biomaterials 23, 2002, pp. 4307-4314.

Nishikubo, T., "Chemical Modification of Polymers via a Phase-Transfer Catalyst or Organic Strong Base," American Chemical Society Symposium Series, 1997, American Chemical Society, pp. 214-230.

Niu, Sanjun, et al., "Stability of Order in Solvent-Annealed Block Copolymer Thin Films," Macromolecules, vol. 36, No. 7, 2003, Univ. of Nebraska, USA, pp. 2428-2440, (web release date: Mar. 13, 2003) (http://digitalcommons.uni.edu/cgi/viewcontent.cgi?article+1005 &contect=chemeng_nanotechnology).

Olayo-Valles, R., et al., "Large Area Nanolithographic Templates by Selective Etching of Chemically Stained Block Copolymer Thin Films," J. Mater. Chem, 2004, 14, The Royal Society of Chemistry, pp. 2729-2731.

Parejo, P. G., et al., "Highly Efficient UV-absorbing Thin-film Coatings for Protection of Organic Materials Against Photodegradation," J. Mater. Chem., 2006, 16, The Royal Society of Chemistry, pp. 2165-2169.

Park, Cheolmin, et al., "Enabling Nanotechnology with Self Assembled Block Copolymer Patterns," Polymer 44, 2003, pp. 6725-6760.

Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing LTD, UK, pp. 1-7.

Park, M., et al., "Block Copolymer Lithography: Periodic Arrays of 1011 Holes in 1 Square Centimeter," Science, vol. 276, No. 5317, May 30, 1997, pp. 1401-1404.

Park, Seung Hak, et al., "Block Copolymer Multiple Patterning Integrated with Conventional ArF Lithography," Soft Matter, 2010, 6, Royal Society of chemistry, pp. 120-125.

Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.

METHODS OF PATTERNING A SUBSTRATE INCLUDING MULTILAYER ANTIREFLECTION COATINGS

CROSS-REFERENCE TO RELATED APPLICATIONS

This application is a divisional of U.S. patent application Ser. No. 11/766,663, filed Jun. 21, 2007, now U.S. Pat. No. 8,294,139, issued Oct. 23, 2012. The disclosure of the previously referenced U.S. patent application is hereby incorporated by reference in its entirety. This application is also related to U.S. patent application Ser. No. 11/787,928, filed Apr. 18, 2007, now U.S. Pat. No. 7,959,975, issued Jun. 14, 2011. This application is also related to U.S. patent application Ser. No. 12/259,921, filed Oct. 28, 2008, now U.S. Pat. No. 8,097,175, issued Jan. 17, 2012.

FIELD OF THE INVENTION

Embodiments of the invention relate to semiconductor fabrication and, more particularly, to methods of patterning substrates, methods of creating antireflection layers, and devices including the same.

BACKGROUND

Conventional semiconductor processing involves implanting or depositing regions or layers of different material either into or on different regions of a semiconductor substrate. To ensure that the material is positioned at the correct location on the semiconductor substrate, a photo imaging process is conventionally used to define the regions that will subsequently receive the material. The conventional photo imaging process, known as photolithography, may involve projecting light waves onto a photoresist surface so that the light reacts with the photoresist to create an imaged pattern. The photoresist may then be selectively removed as a result of the exposure such that a region of the semiconductor device is exposed to receive the additional material.

In some cases, light waves propagate through the photoresist, reach the underlying substrate, and reflect from the substrate surface back through the photoresist. The reflected light can interfere with other waves propagating through the photoresist and ultimately reduce the accuracy and precision of the image being transferred. In particular, the reflected light can interfere and scatter light waves that are being directed toward a particular region of the photoresist which in turn reduces the effectiveness of exposure intended for the region. As a consequence, the region of the photoresist may not be as uniformly exposed and selective removal of the photoresist during subsequent processing steps may be affected. Furthermore, light reflected from the substrate surface can scatter, especially if the substrate surface is non-planar, such that the scattered light can inadvertently expose the photoresist surrounding the desired region of the photoresist. Thus, the reflected light can expose regions of the photoresist that should otherwise remain unexposed, which limits the ability to precisely define regions of the photoresist for selective removal.

To address this particular problem associated with the photo imaging process, antireflective coatings or layers are commonly used to attenuate or absorb the light waves reflected from the substrate surface during photo exposure operations. Antireflective coatings are materials generally known for their ability to absorb various wavelengths of radiation. They are conventionally interposed between the substrate surface and the photoresist so as to serve as a barrier that inhibits the reflected waves from traversing back through the photoresist and adversely affecting the imaging process. Dielectric antireflective coating (DARC) and bottom antireflective coating (BARC) are examples of antireflective materials that are commonly used to absorb radiation reflected from the substrate surface during the photo imaging operations of integrated circuit processing.

Conventional BARC and DARC layers do not attenuate or absorb all of the light waves and are most effective at absorbing light received from a single angle. In an attempt to improve efficiency of antireflective coatings, double-layer coatings of thin films of SiO, $CeO_2$ and ZnS formed by vacuum evaporation have been utilized. A single-layer antireflective coating may be, for example, 90% effective at absorbing reflected light. A second antireflective coating would absorb 90% of the light that passes through the first single-layer antireflective layer. Thus, a multilayer antireflective coating exponentially increases the amount of reflected light that may be absorbed. However, such structures are cost prohibitive and time intensive as each layer must be individually deposited. Antireflective coatings are also used in other applications and devices such as CMOS imagers and optical devices, with similar limitations. Accordingly, there is a need for affordable multilayer antireflection coatings that may be formed efficiently.

DETAILED DESCRIPTION

Figure 1:
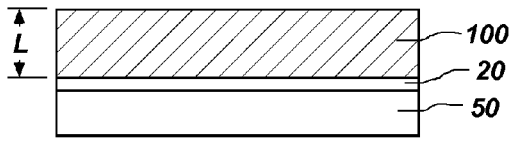
FIG. 1 is a cross-sectional view of an embodiment of the invention including a substrate having a block copolymer cast to a thickness "L" thereon.

The following description with reference to the drawings provides illustrative example of devices and methods according to embodiments of the invention. Such description is for illustrative purposes only and non-limiting of the scope of the invention. Other embodiments of devices and methods in accordance with the invention may be implemented.

Use of self-assembling block copolymers as described herein involves a single annealing step to create a multilayer antireflection layer resulting in a faster and less expensive processing alternative. As stated, conventional BARC and DARC layers do not attenuate or absorb all of the light waves and are most effective at attenuating light received from a single angle. By using multilayer block copolymers with random grain orientation, angular dependence is removed and increased efficiency of the antireflective layer is achieved. Self-assembling block copolymer films spontaneously assemble into periodic structures by microphase separation of the constituent polymer blocks after annealing, for example, by thermal annealing above the glass transition temperature of each block of the copolymer or by solvent annealing, forming domains at nanometer-scale dimensions. In one embodiment, self-assembling block copolymers may be used to create multilayer antireflective layers or coatings on a substrate. The term "substrate" or "semiconductor substrate" or "semiconductive substrate" or "semiconductive wafer fragment" or "wafer fragment" or "wafer" means any construction comprising semiconductor material, including, but not limited to, bulk semiconductive materials such as a semiconductive wafer (either alone or in assemblies comprising other materials). The tem). "substrate" also refers to any supporting structure including, but not limited to, glass, plastics, semiconductive substrates, wafer fragments, wafers, silicon wafers, silicon-on-insulator ("SOI") substrates, silicon-on-sapphire ("SOS") substrates, epitaxial layers of silicon on a base semiconductor foundation and other semiconductor materials such as silicon-germanium, germanium, gallium arsenide and indium phosphide.

Block copolymers are polymers that include one or more long sequences (i.e., "blocks") of the same monomeric unit(s) covalently bound to one or more long sequences (i.e., "blocks") of unlike type, for example, including differing monomeric unit(s). Block copolymers are conventionally named using the word "-block-" or "-b-" to separate each monomeric unit, while random copolymers are conventionally named using the term "-random-" or an "-r-" to separate each monomeric unit. A wide variety of block copolymers are contemplated herein including diblock copolymers (copolymers having two blocks), triblock copolymers (copolymers having three blocks), multiblock copolymers (copolymers having more than three blocks), and combinations thereof.

In one embodiment, the block copolymer is a diblock copolymer. Diblock copolymers may be symmetric (i.e., the volume fraction of the first diblock copolymer is substantially the same as the volume fraction of the second block) or asymmetric (i.e., the volume fraction of the first block is substantially different than the volume fraction of the second block). As used herein, each block of a symmetric diblock copolymer has a volume fraction of from 0.4 to 0.6. As used herein, each block of an asymmetric diblock copolymer has a volume fraction less than 0.4 or greater than 0.6. Film morphology, including the size and shape of the microphase separated domains may be controlled by the molecular weight and volume fraction of the AB blocks of a diblock copolymer to produce lamellar, cylindrical or spherical morphologies, among others. For example, for volume fractions at ratios greater than about 80:20 of the two blocks (A:B) of a diblock copolymer, a block copolymer film will microphase, separate and self-assemble into periodic spherical domains with spheres of polymer B surrounded by a matrix of polymer A. For ratios of the two blocks between about 60:40 and 80:20, the diblock copolymer assembles into a periodic hexagonal close-packed or honeycombed array of cylinders of polymer B within a matrix of polymer A. For ratios between about 50:50 and 60:40, lamellar domains or alternating stripes of the blocks are formed, which is preferred for the present invention. The domain size preference depends upon the wavelength being attenuated and is generally one-fourth of the wavelength.

The block copolymers may self-assemble in a registered manner to create stacks of alternating planes of lamellar domains oriented substantially parallel to the substrate. In another embodiment, the block copolymers self-assemble in a polycrystalline manner to create a multitude of zones of lamellae, each zone in either a substantially parallel or substantially perpendicular orientation to an underlying substrate. The antireflective layers may be sacrificial and removed, for example, at the same time as a photolithographic mask is removed. In other embodiments, the antireflective layers may remain with the final structure such as, for example, a final antireflective layer in a CMOS imager.

In one embodiment, a diblock copolymer 100 is used as an antireflective film on a substrate to be patterned. Referring to FIG. 1, a symmetric block copolymer 100 may be applied to a substrate 50 by any suitable means such as spin-coating. Creation of lamellae having a substantially parallel orientation is driven by differences in wetting interactions for each block on a given surface. Sinusoidal fluctuation in block content relative to a surface interface dampens exponentially with distance from the interface and is well understood both theoretically and experimentally. Any material that will selectively permit the diblock copolymer 100 to orient in a parallel manner to a surface thereof may be used for the surface of the substrate 50. However, other materials may be used for the substrate 50 if the substrate is treated with a material that may permit the block copolymer to orient substantially parallel thereto. Thus, the substrate 50 is not limited to any particular material.

For example, to assist the assembly of substantially parallel lamellae, the substrate 50 surface may be preferentially wetted by at least one block of the block copolymer. By "preferential wetting" it is meant that one block of the block copolymer will wet the surface more easily than the other block(s). For any pair of blocks of a copolymer on a surface, the block with the lower interfacial energy with the surface is the "preferentially wetting" block. The magnitude of preferential wetting is defined by the difference in the interfacial energies between the substrate surface and any two blocks of the block copolymer. Referring to FIG. 1, the substrate 50 surface may be modified by depositing a polymer mat or brush 20 on the substrate surface and cross-linking the polymer mat 20. The cross-linked polymer mat 20 may be used, for example, to make the substrate surface preferential wetting with respect to at least one block of a block copolymer.

For example, when the selected block copolymer is poly (styrene-b-methyl methacrylate) (PS-b-PMMA), silicon oxide and clean silicon surfaces (with native silicon oxide) are exemplary substrates that exhibit preferential wetting toward the PMMA block to result in the assembly of a thin interface layer of PMMA as well as alternating PS and PMMA lamellae on a substrate. Other preferentially wetting surfaces to PMMA may be provided, for example, by silicon nitride, SiOC, SiON, SiC, amorphous carbon, W, $WSi_x$, TiN and resist materials such as methacrylate based components. It will be understood that such preferentially wetting materials may comprise the substrate, rather than the cross-linked polymer mat or brush 20. Most surfaces will preferentially wet one block of a block of a block copolymer. Thus, while FIGS. 1-3 include polymer mat or brush 20, it will be understood that this feature is optional.

In certain embodiments, the polymer mat 20 may be a homopolymer. A homopolymer of one block of the diblock copolymer may be grafted to the substrate 50 to provide a surface that is preferentially wetted by the block of the diblock copolymer that is the same as the grafted homopolymer. For example, if the diblock copolymer that will be self-assembled is a polystyrene-b-polymethylmethacrylate diblock copolymer, a polystyrene homopolymer may be grafted to the substrate to provide a surface that is preferentially wetted by the polystyrene block of the diblock copolymer; or a polymethylmethacrylate homopolymer may be grafted to the substrate to provide a surface that is preferentially wetted by the polymethylmethacrylate block of the diblock copolymer. The homopolymers may be grafted by a wide variety of methods known in the art including, for example, preparing homopolymers with end groups (e.g., hydroxyl groups) that may interact (e.g., by forming hydrogen and/or covalent bonds) with the silicon-containing surface.

In certain embodiments, polymer mat 20 may be cross-linked, for example, by exposure to radiation, e.g., ultraviolet (UV) radiation. In some embodiments, the polymer mat 20 being cross-linked may be susceptible to cross-linking without the addition of a cross-linking agent. For example, if the polymer mat 20 is a polystyrene-r-polymethylmethacrylate random copolymer, the polystyrene in the random copolymer may be a cross-linking site upon exposure to UV radiation. Alternatively, a small amount (e.g., 1 mole % to 5 mole %) of a thermally cross-linkable monomer (e.g., a benzocyclobutane-containing monomer) or a photochemically cross-linkable monomer (e.g., divinyl benzene) may be included in the polymer mat 20. Alternatively, or in addition to, in some embodiments, a cross-linking agent can be added to polymer mat 20. A wide variety of cross-linking agents are known in the art and include, for example, the combination of a cross-linker (e.g., 1,3,5-trimethyl-2,4,6-(triacetoxymethyl)benzene) and a thermal acid generator (e.g., cyclohexylmethyl (2-oxocyclohexyl)sulfonium trifluoromethanesulfonate). The cross-linked polymer mat 20 preferably has resistance adequate to withstand further processing steps encountered during the block copolymer self-assembly.

By way of non-limiting example, the blocks of the block copolymer may be polybutadiene-polybutylmethacrylate, polybutadiene-polydimethylsiloxane, poly(styrene-b-methyl methacrylate) (PS-b-PMMA), polybutadiene-polymethylmethacrylate, polybutadiene-polyvinylpyridine, polybutylmethacrylate-polybutylacrylate, polybutylmethacrylate-polyvinylpyridine, polybutadiene-polyvinylpyridine, polyethyleneoxide-polyisoprene, polyethyleneoxide-polybutadiene, polyethyleneoxide-polystyrene, polyethylene-polyvinylpyridine, polyisoprene-polymethylmethacrylate, polyisoprene-polyvinylpyridine, polybutylacrylate-polymethylmethacrylate, polybutylacrylate-polyvinylpyridine, polyhexylacrylate-polyvinylpyridine, polyisobutylene-polybutylmethacrylate, polyisobutylene-polydimethoxysiloxane, polyisobutylene-polymethylmethacrylate, polyisobutylene-polyvinylpyridine, polyethylene-polymethylmethacrylate, polymethylmethacrylate-polybutylacrylate, polymethylmethacrylate-polybutylmethacrylate, polystyrene-polybutadiene, polystyrene-polybutylacrylate, polystyrene-polybutylmethacrylate, polystyrene-polybutylstyrene, polystyrene-polydimethoxysiloxane, polystyrene-polyvinylpyridine, polyvinylpyridine-polymethylmethacrylate, polystyrene-b-polyisoprene (PS-b-PI), polystyrene-b-lactic acid, or polyethyleneoxide-polymethylmethacrylate. As described herein, the block copolymer may be a diblock copolymer. However, block copolymers having three (a triblock copolymer) or more (a multiblock copolymer) blocks may also be used. Examples of triblock copolymers include, but are not limited to, poly(styrene-block-methyl methacrylate-block-ethylene oxide) and block copolymers having three or more blocks selected from the following: polystyrene, polymethylmethacrylate, polyethyleneoxide, polyisoprene, polybutadiene, poly lactic acid, polyvinylpyridine, and combinations thereof.

The block copolymer material may also be formulated as a binary, tertiary or ternary blend comprising a self-assembling block copolymer and one or more homopolymers of the same type of polymers as the polymer blocks in the block copolymer, to produce blends that swell the size of the polymers domains and increase the $L_o$ value of the polymer. The volume fraction of the homopolymers may range from 0% to 40%. An exemplary ternary diblock copolymer blend is a PS-b-PMMA/PS/PMMA blend, for example, 18K/18K, 25K/26K or 37K/37K PS-b-PMMA containing 40% 20K polystyrene and 20K poly(methylmethacrylate).

Referring to FIG. 1, the block copolymer 100 may be applied to the substrate 50 to a thickness "L" by conventional techniques including, for example, deposition methods, coating methods, transfer methods, and/or other available application methods. The block copolymer 100 may be applied by spin-coating, dip coating, spray coating, and combinations thereof. In such methods, the block copolymer 100 may be dissolved, dispersed, or suspended in a medium (e.g., a solvent). The solution, dispersion, or suspension may be deposited on the substrate 50, and the medium may be optionally removed (e.g., through evaporation at ambient or elevated temperature, and at ambient or reduced pressure) during or subsequent to deposition.

Figure 2:
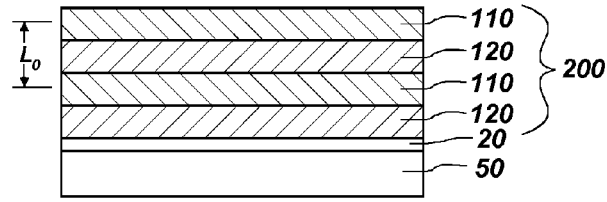
FIG. 2 is a cross-sectional view of an embodiment of the invention including a substrate including a self-assembled block copolymer in a parallel lamellar orientation thereon.

Once the diblock copolymer 100 is deposited on the substrate 50 (or on the polymer mat 20), the diblock copolymer 100 may be annealed to break up existing domains and allow the diblock copolymer 100 to self-assemble (FIG. 2). The diblock copolymer 100 may be annealed by thermal annealing, solvent annealing or a combination thereof. During the annealing, the block polymer may form ordered domains. Thermal annealing may include exposing the diblock copolymer to an elevated temperature (e.g., at or above the glass transition temperature of the diblock copolymer), and, after self-assembly, lowering the temperature to allow the self-assembled diblock copolymer to harden. By way of non-limiting example, the block polymer may be thermally annealed by heating the diblock copolymer to a temperature of from about 0° C. to about 250° C. for up to about 24 hours or longer, preferably under a vacuum or inert atmosphere. Solvent annealing may include exposing the diblock copolymer to a solvent until the block copolymer swells. At least a portion of the solvent may then be removed, such as through evaporation.

The interaction capabilities of the blocks of a block copolymer is referred to with the Greek letter Chi or "X." Chi is an interaction parameter that indicates how chemically distinct each block of the block copolymers is and the energetic cost of mixing the blocks; X*N whether the blocks will microphase separate (where N is the chain length of the monomer). The less that each block (AB) of the block copolymer wants to intermingle (i.e., higher Chi), the better the blocks separate and form alternating layers a/b/a/b/a above a substrate. The layers assume a sinusoidal orientation relative to the interface. The sinusoidal effect may be adjusted by selecting a preferential wetting surface and by selecting each block of the block copolymer, based on conventional knowledge, such that the blocks separate rather than intermingle.

Referring to FIG. 2, each block of the diblock copolymer 100 may self-assemble and form alternating lamellae 110 and 120 that are substantially parallel to a major plane of the substrate 50. The alternating lamellae 110 and 120 form multilayer antireflection coating 200. As used herein, "substantially parallel" lamellae refers to a set of lamellae that are, on average, parallel to the surface. In one embodiment, lamellae 110 and 120 have different indices of refraction. Preferably, at least three (3) to six (6) layers of alternating lamellae are formed. More preferably, at least three (3) to twenty (20) layers of alternating lamellae are formed. A three-layered structure formed from diblock copolymer AB would includes layers (or lamellae) A/B/A. The diblock copolymers form substantially continuous, or nonporous, layers on the substrate surface. In an alternate embodiment, one or more blocks of the block copolymer may form porous layers on the substrate surface.

Symmetric diblock copolymers self-assemble into lamellar structures in which alternating lamellae each represent a domain including one block of the diblock copolymer. The distance between the middle of a first domain and the middle of the next domain of the same block type is the inherent periodicity ($L_o$) of the diblock copolymer, which is dependent on the length and/or molecular weight of the polymer chain for each block (FIG. 2). Thus, the inherent periodicity may be increased by increasing the length and/or molecular weight of the polymer chain for one or both blocks of a diblock copolymer. Conversely, the $L_o$ may be decreased by decreasing the length and/or molecular weight of the polymer chain for one or both blocks of a block copolymer. Block copolymers contemplated herein may have an $L_o$ from about 10 nanometers to 100 nanometers. For methods that use a first and second block copolymer, the $L_o$ of the first block copolymer may be the same as or different from the $L_o$ of the second block copolymer. The desired thickness depends on the degree of ordering relative to an interface. If the lamellae are substantially parallel to the substrate 50 throughout the film, then the thickness of the block copolymer is selected to match the pitch (inherent periodicity). Preferential thickness is either an integral multiple of pitch $L_o$ ($\sim L_o$) or off by one-half $L_o$ (where $(n+\frac{1}{2})L_o$) depending on preferential interface wetting. When both the air and substrate surfaces wet the same block, the preferred thickness is $\sim L_o$, when the two interfaces are preferentially wet by opposite blocks, thickness of $(n+\frac{1}{2})L_o$ is preferred. If the lamellae are not substantially parallel to the surface throughout films above a certain thickness, then the films may be any thickness above that minimal value as the regions that are not substantially parallel may be any thickness without an energetic cost.

In certain embodiments, it may be preferable to enhance the stability of the lamellae. Thus, in one embodiment, lamellae 110 and/or 120 may be optionally cross-linked, for example, by exposure to radiation, e.g., ultraviolet (UV) radiation. In some embodiments, the block(s) of the block copolymer being cross-linked may be susceptible to cross-linking without the addition of cross-linking agent. For example, if the block copolymer is a polystyrene-b-polymethylmethacrylate diblock copolymer, the polystyrene block may be cross-linked by exposure to UV radiation. Alternatively, one block of the block copolymer may be made cross-linkable by including a small amount (e.g., 1 mole % to 5 mole %) of thermally cross-likable monomer (e.g., a benzo-cyclobutane-containing monomer) or a photochemically cross-likable monomer (e.g., divinyl benzene) in the block of the copolymer. Alternatively, or in addition to, in some embodiments, cross-linking agent can be added to the lamellae that are to be cross-liked. A wide variety of cross-linking agents are known in the art and include, for example, the combination of a cross-linker (e.g., 1,3,5-trimethyl-2,4,6-(tri-acetoxymethyl)benzene) and a thermal acid generator (e.g., cyclohexylmethyl(2-oxocyclohexyl)sulfonium trifluoromethanesulfonate). A cross-linked domain may have, for example, improved mechanical robustness.

For methods that use a first and second block copolymer, the first block copolymer and the second block copolymer preferably have different refractive indexes. Each block of a block copolymer may differ from other blocks in the copolymer not only in terms of the structure of monomeric units that form that block, but also in other properties including, for example, physical properties (e.g., mechanical strength, surface tension, wettability, and/or solubility) and chemical properties (e.g., solubility, refractive index, chemical reactivity, susceptibility to removal techniques and/or susceptibility to cross-linking reactions). Chain length of each block copolymer may be conventionally selected based on the desired wavelength to be reflected.

In certain embodiments, at least one block of a block copolymer may be optionally doped or otherwise modified to alter its refractive index. For example, dyes or inorganic materials may be incorporated into at least one block of the block copolymer prior to casting. In one embodiment, a water-insoluble photochromic dye may be incorporated into a hydrophobic core of a block copolymer. In one embodiment, metal-functional monomers may be polymerized to form metal-containing block copolymers. In one embodiment, pre-formed copolymers may be directly blended with metallic nanoparticles, nanoclusters or quantum dots. In yet another embodiment, ligand functional polymers may be prepared by either direct polymerization of ligand functional monomers or by the post-polymerization modification of appropriate precursor polymers.

By way of non-limiting example, a film of annealed, parallel lamellae of polystyrene-b-poly(4-vinylpyridine) may be exposed to a poly(4-vinylpyridine)-selective solvent containing gold molecules. The gold is thus selectively placed in the poly(4-vinylpyridine) domains. The film may then be further exposed to a poly(4-vinylpyridine)-selective solvent containing a reducing agent, which converts the gold molecules to gold nanoparticles in the poly(4-vinylpyridine) domains. In another non-limiting example, one block of a block copolymer (for example, PS-b-PMMA or poly(hydroxylated isoprene) may be exposed to vapors of a metallic species such that the metallic species is selectively incorporated into one block of the block copolymer prior to forming the block copolymer. In yet another non-limiting example, polystyrene-b-poly(4-phenylethynylstyrene) (PS-PPES) may be exposed to cobalt carbonyl in toluene to create cobalt doped PPES. Exemplary metal species include, but are not limited to, gold, platinum, cobalt, iron, palladium, nickel, copper, zinc, ruthenium, silver, rhodium, aluminum, yttrium, chromium, manganese, vanadium, tin, and rhenium. Doping one block of the diblock copolymer with an inorganic material assists in the segregation of the blocks into separate domains and varies the optical properties of the resulting film, which improves the performance of the antireflective layer.

Figure 3:
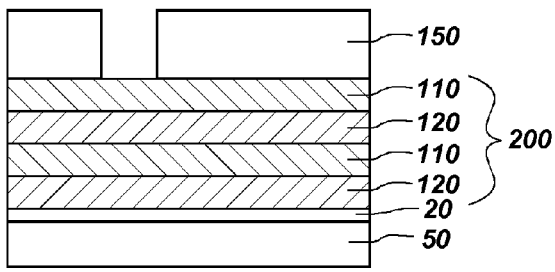
FIG. 3 is a cross-sectional view of an embodiment of the invention including a substrate including a self-assembled block copolymer antireflection layer.

Referring to FIG. 3, following the self-assembly of the diblock copolymer to form a multilayer antireflection coating 200, photoresist 150 may be patterned on an upper surface of the multilayer antireflection coating 200 for conventional photo-imaging. Selected areas of photoresist may be exposed to radiation from a light source to form a desired pattern on the photoresist by conventional techniques. The multilayer antireflection coating 200 will absorb light that has reflected back from the substrate surface, thereby inhibiting the light from traveling through the photoresist. The multilayered composition of the antireflection layer increases the amount of light that is absorbed by the antireflection layer. By selecting each block of the diblock copolymer to have different indices of refraction, the amount of absorbed light may also be increased. After transferring the pattern to the substrate, and etching or otherwise removing a portion of the substrate 50 by conventional techniques, the photoresist 150 and antireflection layer may be removed by conventional techniques resulting in a patterned substrate.

Figure 4:
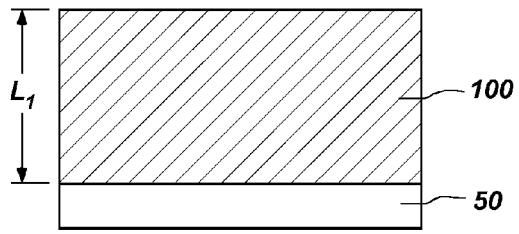
FIG. 4 is a cross-sectional view of an embodiment of the invention including a substrate having a block copolymer cast to a thickness $L_1$ thereon.
Figure 5:
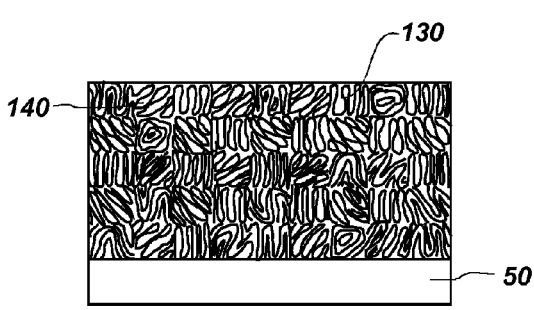
FIG. 5 is a cross-sectional view of an embodiment of the invention including a self-assembled block copolymer having polycrystalline morphology thereon.

An antireflection layer including multiple, planar layers, is best suited for applications in which the light contacts the antireflection layer in a substantially perpendicular orientation. In other embodiments, it may be preferable to include an antireflection layer configured to absorb light from a multitude of angles. For example, in optical applications such as glasses, sunglasses, cut-off filters, binoculars, etc., light may enter through a variety of angles. An antireflection layer configured to attenuate light from a multitude of angles may also be useful when patterning a substrate. Thus, in one embodiment, a block copolymer 100 may be applied to a substrate 50 where the domain size "$L_1$" (thickness) of each block over a substrate is λ/4 (where λ is the wavelength used) (FIG. 4). An annealing step may be performed, but is not required provided that adequate self-assembly occurs during spin-coating. The volatility of the solvent used for spin-coating will impact this. Thin films prepared on a neutral-wetting substrate and annealed do not have any preferential orientation of domains and will assemble into a disordered fingerprint-like structure despite extensive annealing as shown in FIG. 5. As shown in FIG. 5, domains are created such that a first domain 130 is oriented substantially perpendicular to a major plane of the underlying substrate 50 and a second domain 140 is oriented substantially parallel to the major plane of substrate 50.

Figure 9:
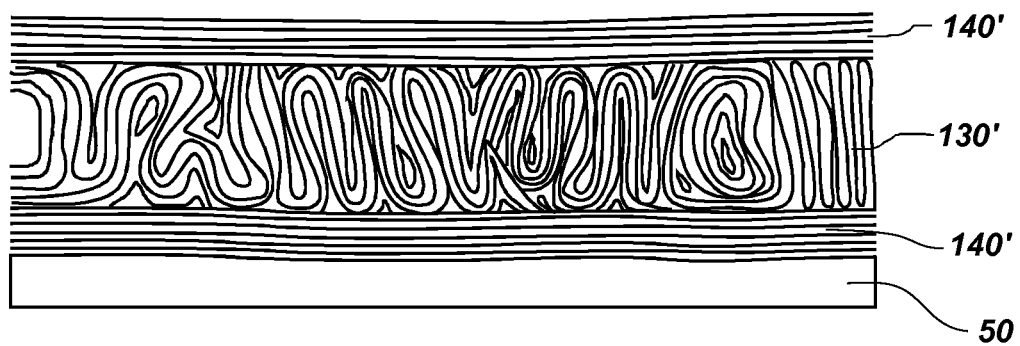
FIG. 9 is a cross-sectional view of an embodiment of the invention including a self-assembled block copolymer having polycrystalline morphology thereon.

Referring to FIG. 9, when using thicker films where the dimensions of an inner section are greater than the grain size (e.g., average distance over which all the lamellae are oriented more or less identically), and the regions proximate the interfaces will be substantially parallel 140' to the interfaces, the self-assembled polymer in the center of the film is mostly oriented in a quasi-perpendicular morphology 130' relative to substrate 50, with some bending and the formation of T-junctions where the parallel and perpendicular regions overlap.

Figure 6:
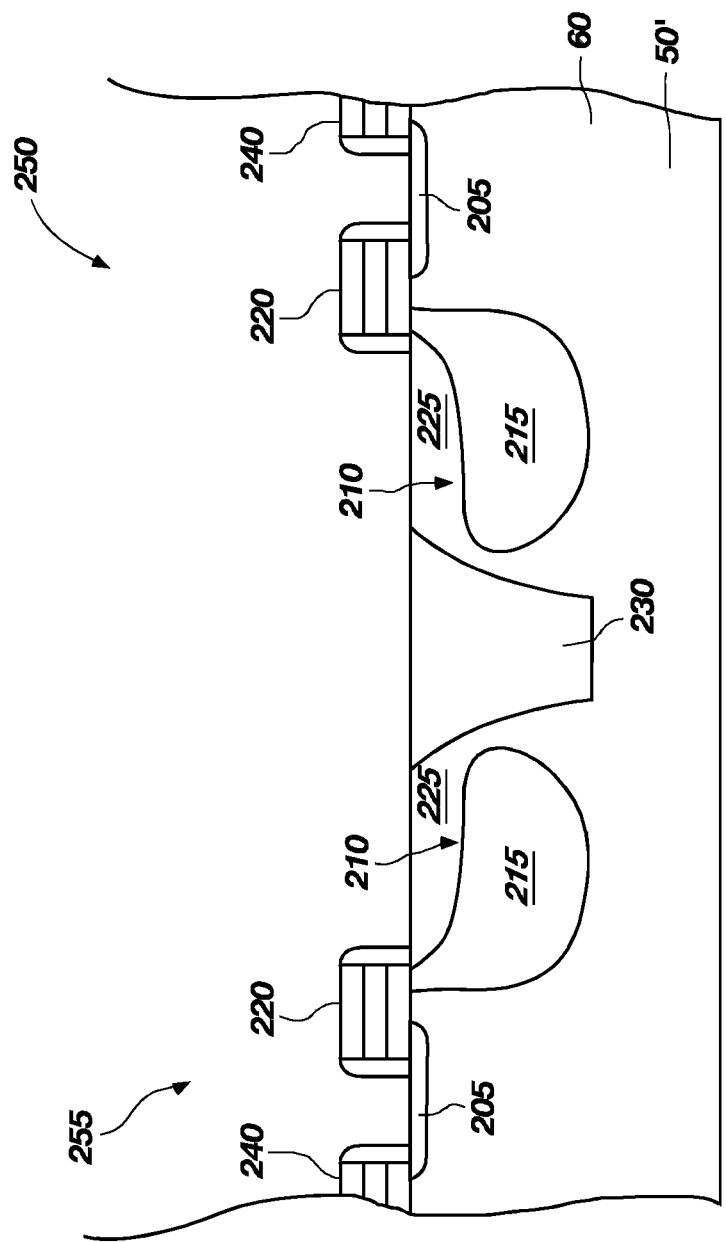
FIG. 6 is a cross-sectional view of an embodiment of the invention including a portion of a conventional CMOS image sensor including photodiodes of two CMOS image sensor pixels.

In one embodiment, a complementary metal oxide semiconductor (CMOS) imager includes a multilayer antireflection coating including self-assembled block copolymers. The preliminary process steps of forming a CMOS imager may proceed by conventional methods. FIG. 6 illustrates an exemplary view of a portion of a conventional CMOS image sensor four-transistor (4T) pixel. The exemplary CMOS image sensor includes two adjacent pixels 250, 255 and a light-sensing element, shown as a photodiode 210, that may be formed having a photosensitive p-n junction region comprising a p-type surface layer 225 and an n-type photodiode region 215 within a p-type region 60. P-type region 60 may be formed on substrate 50'. It will be understood that the light-sensing element is not restricted to a photodiode, but may be selected from any light-sensing element including, without limitation, photogates, pinned photodiodes, partially pinned photodiodes, etc. Further, while a 4T pixel is shown, it will be understood that the self-assembled block copolymer antireflection coating may be incorporated into any CMOS or CCD (charge-coupled device) image sensors.

In a conventional CMOS image sensor, photodiodes 210 may be separated by isolation region 230, for example, a field oxide or short trench isolation. The trench isolation region may be conventionally formed in a p-well active layer in a p-type region 60 adjacent to n-type photodiode region 215 to isolate the pixels 250, 255. The n-type photodiode region 215 may function as a charge collection region of a photodiode 210 for collecting charges generated by light incident on a pixel. A conventional CMOS image sensor may also include a transfer transistor having a gate 220 for transferring photoelectric charges from the charge collection region to the floating diffusion region 205. The CMOS image sensor may also include a reset transistor having a gate 240. It will be understood that gate stacks for the pixel transistors may be formed before or after the trench isolation regions are formed. The order of these preliminary process steps may be varied as is required or convenient for a particular process flow.

Figure 7:
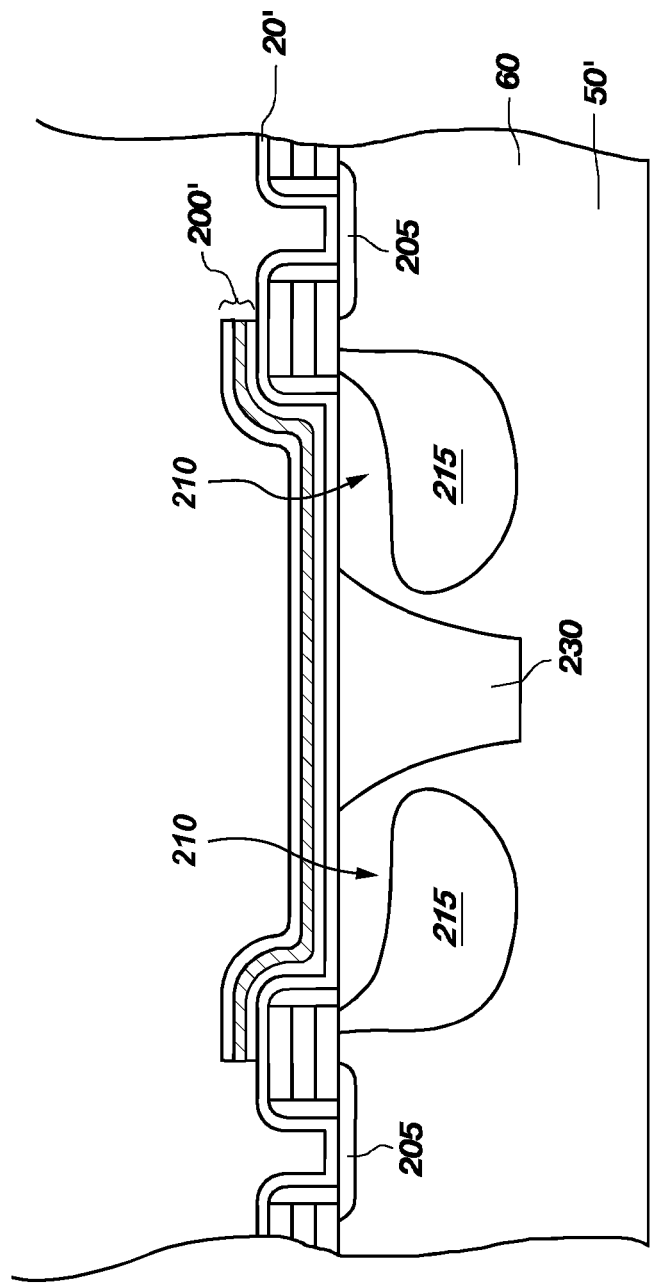
FIG. 7 is a cross-sectional view of an embodiment of the invention including a CMOS image sensor pixel including a self-assembled block copolymer having antireflection coating thereon.

As incident light strikes the photodiode 210, some portion is reflected (i.e., not sensed by the photodiode 210). Thus, referring to FIG. 7, in one embodiment, a multilayer antireflection layer or coating 200' may be used to minimize the amount of light reflected from the photodiode 210. A block copolymer may be deposited over the CMOS image sensor as described herein. In one embodiment, the block copolymer is deposited to a thickness of 1 μm to 10 μm. In an embodiment depicted in FIG. 7, the block copolymer may be cast under conditions that allow the block copolymer to self-assemble into lamellae that are substantially parallel to the underlying substrate 50'. Thus, as described, a polymer mat 20' may be required to create a preferential wetting surface for the block copolymer. After deposition, the block copolymer may be annealed to form a multilayer antireflection coating 200' and then selectively etched, or otherwise patterned, such that the multilayer antireflection coating 200' is only present over the photodiode 210. Alternatively, after deposition, the block copolymer may be annealed to form a multilayer antireflection coating 200' over the entire device. The CMOS imager may then be subjected to further conventional processing such as, for example, deposition of an oxide layer thereover.

Figure 8:
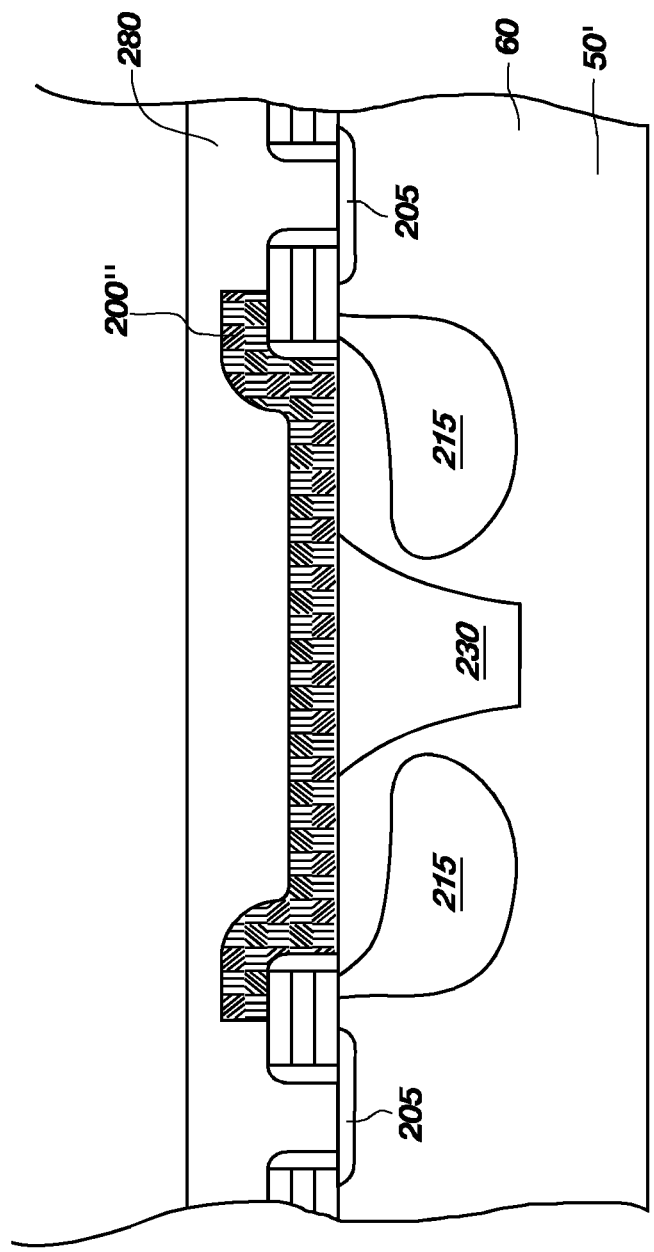
FIG. 8 is a cross-sectional view of an embodiment of the invention including a CMOS image sensor pixel including a self-assembled block copolymer having antireflection coating thereon.

Referring to FIG. 8, in one embodiment, the antireflection coating 200" includes a plurality of block copolymer domains randomly oriented either parallel or perpendicular to the major plane of an underlying substrate 50'. A block copolymer may be applied to the substrate 50' at a thickness of 1 μm to 100 μm and an annealing step may be optionally performed. Thin films prepared on a flat substrate and annealed do not have any preferential orientation of domains and will assemble into a disordered fingerprint-like structure despite extensive annealing as shown and described in FIG. 5. The CMOS imager may then be subjected to further conventional processing such as, for example, deposition of an oxide layer 280 thereover.

The invention may be further understood by the following non-limiting examples.

EXAMPLE 1

A film of lamellar-forming PS-PMMA ($M_n$=71.9 Kg/mol, PDI=1.06, inherent periodicity or pitch $\{L_o\}$ of ~30 nm) is coated at a thickness of 315 nm (10.5*$L_o$) onto a substrate which preferentially wets the PMMA domain and the difference in interfacial energies for PS and PMMA with the substrate is 0.75 ergs/cm². The film is thermally annealed above the glass transition temperature of the blocks under an inert atmosphere for sufficient time to induce ordered self-assembly relative to the substrate and air interfaces, e.g., 24 hours at 250° C. The lamellar structures assemble so that PMMA wets the substrate interface and PS wets the air interface to form ten and one-half periods or twenty total PS-PMMA interfaces with a domain size for each lamellar plane of 15 nm. The $L_o$ value (and corresponding domain size) may be increased by using either higher molecular weight block copolymer or creating a ternary blend of the PS-PMMA block copolymer with homopolymers of PS and PMMA. If the difference in interfacial energies for PS and PMMA with the substrate is >0.75 ergs/cm$^2$, the number of periods in the film may be increased in proportion with the increase in surface energy differential.

EXAMPLE 2

A film of lamellar-forming PS-PMMA ($M_n$=71.9 Kg/mol, PDI=1.06, inherent periodicity or pitch {$L_o$} of ~30 nm) is coated at a thickness of 795 nm (26.5*$L_o$) onto a substrate which preferentially wets the PMMA domain and the difference in interfacial energies for PS and PMMA with the substrate is ≤0.5 ergs/cm$^2$. The film is thermally annealed above the glass transition temperature of the blocks under an inert atmosphere for sufficient time to induce ordered self-assembly relative to the substrate and air interfaces, e.g., 24 hours at 250° C. The lamellar structures assemble so that PMMA wets the substrate interface to a distance of ≤3 pitches (six PS-PMMA interfaces) with 100% parallel domains, and PS wets the air interface to form two to three pitches (four to six PS-PMMA interfaces) of 100% parallel domains relative to the air interface. The self-assembled polymer in the center of the film is mostly oriented in a quasi-perpendicular morphology relative to the substrate, with some bending and the formation of T-junctions where the parallel and perpendicular regions overlap (see, e.g., FIG. 9). The $L_o$ value (and corresponding domain size) can be increased by using either higher molecular weight block copolymer or creating a ternary blend of the PS-PMMA block copolymer with homopolymers of PS and PMMA.

EXAMPLE 3

A substrate is grafted with a random PS-r-PMMA copolymer with a fractional mol % of PS of ≤60% such that the surface energy differential for homopolymers of PS and PMMA is around 0.0625 ergs/cm$^2$. A blend is prepared of PS-b-PMMA $M_n$=71.9 Kg/mol, PDI=1.06, inherent periodicity or pitch {$L_o$} of ~30 nm) and (α-perfluorodacanoyl-ω-TEMPO)-PS-r-PMMA with a fractional mol % of PS approximately equal to that of the surface grafted PS-r-PMMA. As the fluorinated alkyl tail of the random copolymer preferentially wets an air interface, during an anneal procedure this material preferentially migrate to that interface and orient such that the PS-r-PMMA segments interact with the block copolymer. The synthesis and use of such materials is described in E. Huang, et al., "Using Surface Active Random Copolymers To Control the Domain Orientation in Diblock Copolymer Thin Films," Macromolecules, 1998, 31, 7641-7650. The composition of the blend is defined so that for a given total film thickness spun-cast from a solution of the blend over a nanometer-square area, the (α-perfluorodacanoyl-ω-TEMPO)—PS-r-PMMA will account for 6 nm$^3$ of the volume of film. The blended film is thermally annealed above the glass transition temperature of the blocks under an inert atmosphere for sufficient time to induce ordered self-assembly relative to the substrate and air interfaces, e.g., 24 hours at 250° C.; the (α-perfluorodacanoyl-ω-TEMPO)-PS-r-PMMA will phase segregate to the air interface selectively. The surface energy differentials for the block copolymer at the surface and "air" interfaces are projected to provide no exclusive bias toward either parallel or perpendicular structures, and so the bounded block copolymer thin film will self-assemble as the material in bulk, with no long-range ordering or preferred orientation to interfaces (see, e.g., FIG. 5).

EXAMPLE 4

A film of lamellar forming polystyrene-block-poly(4-vinylpyridine) or PS-b-P4VP (21 400 g/mol and 20 700 g/mol, respectively, PDI 1.14, inherent periodicity or pitch {$L_o$} of 33 nm) is coated onto a silicon oxide surface at a thickness of 5.5*33 nm=181.5 nm and annealed at 180° C. for 36 hours in a vacuum oven. The lamellar structures self-assemble so that a P4VP domain wets the substrate interface and a PS domain wets the air interface, forming ten interfaces between the domains in the film. The film is soaked in a 1% solution of hydrogen tetrachloroaurate(III) {HAuCl$_4$} in ethanol for up to 10 minutes; this selectively impregnates the P4VP domains with gold species. The film is then placed in a 1% solution of sodium borohydride {NaBH$_4$} in ethanol for up to 30 seconds to reduce the hydrogen tetrachloroaurate to gold nanoparticles ~3 nm in diameter located exclusively in the P4VP domains.

The invention is susceptible to various modifications and alternative forms in addition to specific embodiments shown by way of example in the drawings and described in detail herein. Thus, the invention is not limited to the particular forms disclosed. Rather, the scope of the invention encompasses all modifications, equivalents, and alternatives falling within the following appended claims.

What is claimed is:

1. A method of patterning a substrate, comprising:
   allowing a block copolymer to self-assemble to form alternating layers of a block copolymer over a substrate, wherein each layer of the alternating layers includes a lamellae of a block of the block copolymer and each lamellae is oriented substantially parallel to a major plane of the substrate;
   patterning a resist over the self-assembled block copolymer layer; and
   exposing the substrate to a light source.

2. The method of claim 1, further comprising doping a first block of the block copolymer prior to allowing a block copolymer to self-assemble.

3. The method of claim 2, wherein doping a first block of the block copolymer comprises incorporating a dye or inorganic material into the first block of the block copolymer.

4. The method of claim 2, wherein doping a first block of the block copolymer comprises incorporating a water-insoluble photochromic dye into a hydrophobic core of the first block of the block copolymer.

5. The method of claim 2, wherein doping a first block of the block copolymer comprises incorporating a dopant selected from the group consisting of gold, platinum, cobalt, iron, palladium, nickel, copper, zinc, ruthenium, silver, rhodium, aluminum, chromium, manganese, yttrium and rhenium into the first block of the block copolymer.

6. The method of claim 1, further comprising cross-linking the self-assembled block copolymer layer prior to exposing the substrate to a light source.

7. The method of claim 1, wherein allowing a block copolymer to self-assemble comprises allowing the block copolymer to self-assemble to form at least three alternating layers of the block copolymer over the substrate.

8. A method of patterning a substrate, comprising:
   forming a multilayer coating over a polymer mat and a substrate, the multilayer coating comprising self-assembled block copolymer domains including a plurality of zones of lamellae, each domain of the plurality of self-assembled block copolymer domains being above or below an adjacent self-assembled block copolymer domain;

patterning a resist over the multilayer coating; and exposing the substrate to a light source.

9. The method of claim 8, wherein forming a multilayer coating comprises:

forming a block copolymer on the polymer mat; and annealing the block copolymer.

10. The method of claim 8, wherein forming a multilayer coating comprises forming a multilayer coating including between 3 zones of lamellae and 20 zones of lamellae.

11. The method of claim 8, wherein forming a multilayer coating further comprises exposing the plurality of zones of lamellae to ultraviolet radiation.

12. The method of claim 8, wherein forming a multilayer coating comprises forming the self-assembled block copolymer domains including the plurality of zones of lamellae, each zone of the plurality of zones independently oriented substantially parallel or substantially perpendicular to a major plane of the substrate.

13. A method of patterning a substrate, comprising:

applying a block copolymer over a substrate;

annealing the block copolymer to form a self-assembled block copolymer including zones of lamellae, a first zone of lamellae proximate an air interface and a second zone of lamellae below the first zone of lamellae and proximate an interface with the substrate;

patterning a photoresist on an upper surface of the self-assembled block copolymer; and exposing the substrate to radiation.

14. The method of claim 13, further comprising forming a polymer mat over the substrate.

15. The method of claim 14, further comprising cross-linking the polymer mat.

16. The method of claim 13, wherein applying a block copolymer over a substrate comprises applying a diblock copolymer over the substrate.

17. The method of claim 13, wherein applying a block copolymer over the substrate comprises applying more than one block selected from the group consisting of polybutadiene-polybutylmethacrylate, polybutadiene-polydimethylsiloxane, poly(styrene-b-methyl methacrylate) (PS-b-PMMA), polybutadiene-polymethylmethacrylate, polybutadiene-polyvinylpyridine, polybutylmethacrylate-polybutylacrylate, polybutylmethacrylate-polyvinylpyridine, polybutadiene-polyvinylpyridine, polyethyleneoxide-polyisoprene, polyethyleneoxide-polybutadiene, polyethyleneoxide-polystyrene, polyethylene-polyvinylpyridine, polyisoprene-polymethylmethacrylate, polyisoprene-polyvinylpyridine, polybutylacrylate-polymethylmethacrylate, polybutylacrylate-polyvinylpyridine, polyhexylacrylate-polyvinylpyridine, polyisobutylene-polybutylmethacrylate, polyisobutylene-polydimethoxysiloxane, polyisobutylene-polymethylmethacrylate, polyisobutylene-polyvinylpyridine, polyethylene-polymethylmethacrylate, polymethylmethacrylate-polybutylacrylate, polymethylmethacrylate-polybutylmethacrylate, polystyrene-polybutadiene, polystyrene-polybutylacrylate, polystyrene-polybutylmethacrylate, polystyrene-polybutylstyrene, polystyrene-polydimethoxysiloxane, polystyrene-polyvinylpyridine, polyvinylpyridine-polymethylmethacrylate, polystyrene-b-polyisoprene (PS-b-PI), polystyrene-b-lactic acid, and polyethyleneoxide-polymethylmethacrylate over the substrate.

18. The method of claim 13, wherein annealing the block copolymer comprises exposing the block copolymer to a temperature between about 0° C. and about 250° C.

19. The method of claim 13, further comprising exposing the zones of lamellae to ultraviolet radiation.

20. The method of claim 13, further comprising doping at least one block of the block copolymer before annealing the block copolymer.

* * * * *

UNITED STATES PATENT AND TRADEMARK OFFICE
CERTIFICATE OF CORRECTION

PATENT NO.        : 8,551,808 B2                                     Page 1 of 1
APPLICATION NO.   : 13/613358
DATED             : October 8, 2013
INVENTOR(S)       : Eugene P. Marsh et al.

It is certified that error appears in the above-identified patent and that said Letters Patent is hereby corrected as shown below:

On the Title page, in Item (75), under "Inventors", in column 1, line 1, delete "Bosie," and insert -- Boise, --, therefor.

Signed and Sealed this
Twenty-eighth Day of January, 2014

Michelle K. Lee
*Deputy Director of the United States Patent and Trademark Office*